United States Patent [19]

Fukui

[11] 4,359,655
[45] Nov. 16, 1982

[54] TIMER CIRCUIT
[75] Inventor: Hisao Fukui, Kanagawa, Japan
[73] Assignee: Sony Corporation, Tokyo, Japan
[21] Appl. No.: 147,341
[22] Filed: May 7, 1980
[30] Foreign Application Priority Data
  May 10, 1979 [JP] Japan .................................. 54-57375
[51] Int. Cl.³ ........................ H03K 5/13; H03K 5/159
[52] U.S. Cl. ................................ 307/595; 307/252 F; 307/597
[58] Field of Search ................... 307/252 F, 592, 595, 307/247 A, 597, 246; 361/198, 96; 328/185

[56] References Cited
U.S. PATENT DOCUMENTS

| 3,582,716 | 6/1971 | Traina | 361/198 |
| 3,641,397 | 2/1972 | Elliot et al. | 361/198 |
| 4,053,790 | 10/1977 | Myers | 307/594 |
| 4,107,553 | 8/1978 | Carter | 307/597 |
| 4,267,467 | 5/1981 | Tsukada | 307/597 |

Primary Examiner—Stanley D. Miller
Assistant Examiner—B. P. Davis
Attorney, Agent, or Firm—Lewis H. Eslinger; Alvin Sinderbrand

[57] ABSTRACT

A timer circuit for connecting a DC voltage source to an electric device, such as a small portable radio, comprises a switching device, such as a switching transistor, connected between the source and the device and having conductive and non-conductive states; a drive circuit operative to selectively establish the states of the switching device in response to a control voltage; a timing circuit for holding a voltage level that initially decays at a first decay rate from a first voltage related to the voltage of the source of a second voltage, and subsequently decays at a second, different decay rate from the second voltage to a third voltage; and a control device, which may be a thyristor, such as, a programmable unijunction transistor, or a thyristor-like circuit, for providing the control voltage to a drive circuit to cause the latter to establish one of the states of the switching device when the voltage level of the timing circuit is above the third voltage, and to establish the other of the states when the voltage level has decayed to the third voltage.

13 Claims, 6 Drawing Figures

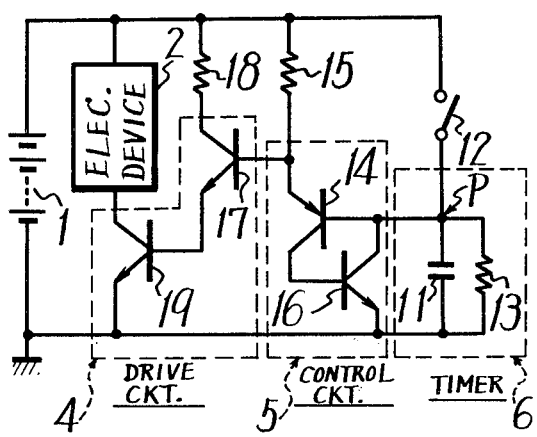
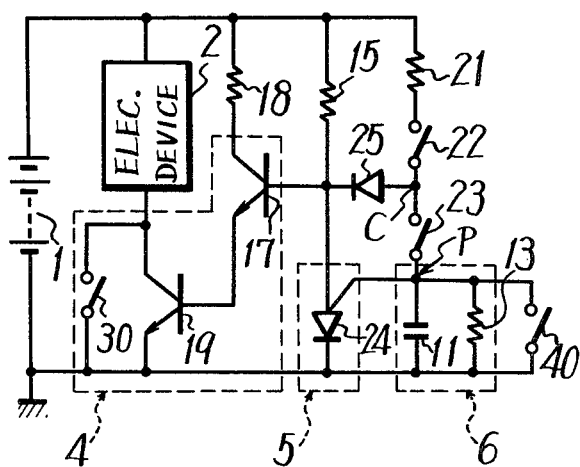
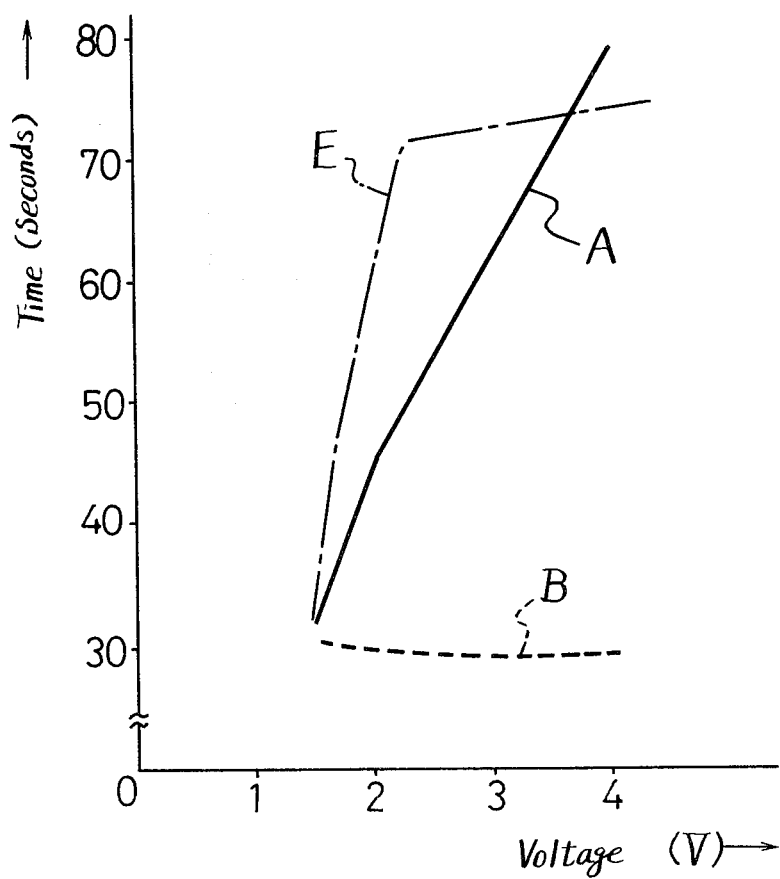

TIMER CIRCUIT

BACKGROUND OF THE INVENTION

1. Field of the Invention

This invention relates generally to a timer circuit, and is more specifically directed to an improved timer circuit for controlling an electric device, such as a battery-operated radio or the like, so that the electric device may be maintained in its ON state for a predetermined time and then automatically turned OFF.

2. Description of the Prior Art

Electric devices, such as battery-operated portable radios, are often provided with a timer circuit to turn the radio ON upon actuation of a switch, and then to automatically turn OFF the radio after a predetermined length of time has elapsed. Bedside radios are conveniently provided with such timer circuits in order to provide music for a predetermined period of time and then to automatically turn OFF after the listener has fallen asleep.

In conventional timer circuits for use with battery-operated devices, as aforesaid, a storage capacitor is charged to the full battery potential, and when a timer switch is operated, the storage capacitor is discharged through a discharge resistor which, with the storage capacitor, forms an RC time constant circuit. The time constant of the RC time constant circuit determines the delay time, that is, the time required for the voltage stored in the storage capacitor to decay from its initial value to a triggering level at which the electric circuit from the battery through the radio is broken. However, after the battery has been used for an extended period, the voltage that it can supply to the storage capacitor drops significantly. The resulting lower voltage stored in the storage capacitor reduces the delay time between switch actuation and the time when the radio is turned off, so that the delay time becomes shorter and shorter as the battery voltage decreases with continued use.

A previous improvement in timer circuits for the above described purpose uses a constant voltage circuit to limit the charging voltage for the storage capacitor to a voltage which is less than the battery voltage. This constant voltage circuit normally includes a number of forward-biased diodes which are connected in parallel with the charging capacitor during the time that the actuating switch is closed. While this improved timer circuit exhibits a substantially constant delay time between switch actuation and shut off during the life of the battery, it has the disadvantage that, for any given RC time constant circuit, the delay time will be significantly lower than with a conventional timer circuit.

Moreover, it is not possible to extend the delay time of the above improved timer circuit merely by increasing the values of the resistive and capacitive elements of the RC time constant circuit. If the value of the storage capacitor, or the value of the discharge resistor is increased to compensate for the inherently shorter delay time of the improved timer circuit, certain problems can arise. For instance, if a storage capacitor of exceptionally high value is used, the leakage current across the capacitor can interfere with the operation of the timer circuit. In addition, high-value storage capacitors tend to be overly bulky and prohibitively expensive, and thus can be impracticable for use with a small portable radio or the like. Alternatively, if an exceptionally high value resistor is selected as the discharge resistor, the discharge current through the discharge resistor will become insignificant in relation to stray leakage currents across the capacitor, such as the leakage current in a thyristor or similar device which is commonly used to turn OFF the electric device when the voltage on the capacitor reaches the triggering level. Thus, an increase in the resistance value of the discharge resistor will not significantly contribute to an increase in the time constant of the RC time constant circuit.

OBJECTS AND SUMMARY OF THE INVENTION

Accordingly, it is an object of this invention to provide an improved timer circuit free of the disadvantages mentioned above.

More particularly, it is an object of this invention to provide a timer circuit which determines a delay time between the actuation of a switch and the turning off of an electric device substantially independently of battery voltage.

It is another object of this invention to provide a timer circuit, as aforesaid, in which the delay time between switch actuation and turning off of the device can be prolonged.

It is yet another object of this invention to provide a timer circuit which can be simply and inexpensively constructed.

According to an aspect of this invention, a timer circuit for connecting a DC voltage source to a radio or other electric device comprises a switching device, such as a switching transistor connected between the source and the device and having conductive and non-conductive states; a drive circuit operative to selectively establish the states of the switching device in response to a control voltage; a timing circuit for holding a voltage level that initially decays at a first decay rate from a first voltage related to the voltage of the source to a second voltage, and subsequently decays at a second, different decay rate from the second voltage to a third voltage; and a control device, which may be a thyristor, such as, a programmable unijunction transistor, or a circuit which is the functional equivalent thereof, for providing the control voltage to the drive circuit to cause the latter to establish one of the conductive and non-conductive states of the switching device when the voltage level of the timing circuit is above the third voltage, and to establish the other of the states when the voltage level has decayed to the third voltage.

In a preferred embodiment, the timing circuit preferably includes a storage capacitor which is switchably connected to the DC voltage source to charge to the battery voltage, a first resistive discharge path through which the storage capacitor discharges until the latter reaches the second voltage, and a second resistive discharge path through which the storage capacitor discharges until the latter reaches the third voltage.

The above, and other objects, features, and advantages of this invention, will be apparent from the following description when read in conjunction with the accompanying drawings in which like reference numerals identify corresponding parts.

BRIEF DESCRIPTION OF THE DRAWINGS

FIG. 1 is a schematic diagram of a conventional timer circuit;

FIG. 2 is a graph showing curves to which reference will be made in describing the timer circuits of FIGS. 1, 3, 5, and 6;

FIG. 3 is a schematic diagram of a timer circuit embodying a previous improvement to the conventional circuit of FIG. 1;

DESCRIPTION OF THE PREFERRED EMBODIMENTS

Figure 4:
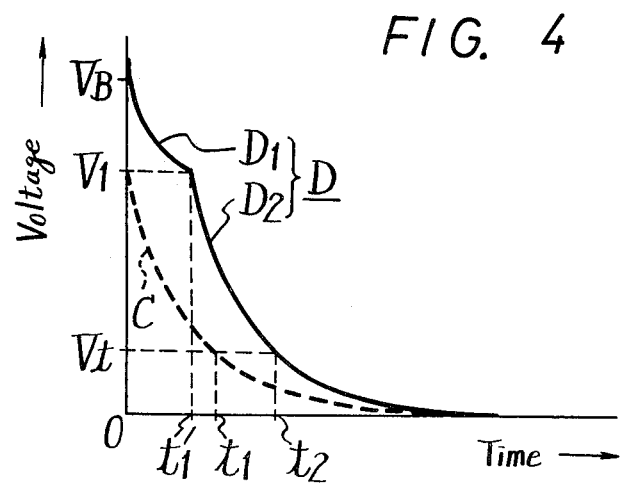
FIG. 4 is a graph showing discharge curves and to which reference will be made in explaining the timer circuit of FIG. 3 and the timer circuits of the present invention.

Referring to the drawings in detail, and initially to FIG. 1 thereof, the construction of a prior art timer circuit there shown will be described so that the features and advantages of the present invention can be better understood. The timer circuit of FIG. 1 is adapted to complete an electrical circuit formed by a DC source, such as, a battery 1, and an electric device 2, such as, a radio or the like. A drive circuit 4 is provided for turning device 2 ON and OFF in response to a control voltage from a control circuit 5 under the influence of a timer 6.

The drive circuit 4 is shown to include a switching transistor 19 having its collector and emitter coupled to electric device 2 and battery 1, respectively, and a driver transistor 17 having its emitter connected to the base of transistor 19, and its collector coupled through a resistor 18 to battery 1. The base of driver transistor 17 is arranged as a control input for the drive circuit 4 and receives the control voltage from control circuit 5. Here the control circuit 5 includes a PNP transistor 14 and an NPN transistor 16 coupled together to form a device that functions like a thyristor. More particularly, the base and collector of transistor 14 are connected to the collector and base, respectively, of transistor 16, the emitter of transistor 16 is connected to the negative terminal of battery 1 and the emitter of transistor 14 provides the control voltage to transistor 17. A resistor 15 is connected between the emitter of transistor 14 and the positive terminal of battery 1.

As is well known, the arrangement of transistors 14 and 16 of control circuit 5 will be cut off whenever the base voltage of transistor 14 is above a predetermined threshold, but will become conductive whenever the base voltage of transistor 14 drops below that threshold.

The timer 6 is shown to include a storage capacitor 11 and a discharge resistor 13 connected in parallel between the negative terminal of battery 1 and a junction point P connected to the base of transistor 14. A switch 12 is connected between junction point P and the positive terminal of battery 1 so that, when switch 12 is closed, battery 1 will charge storage capacitor 11.

With switch 12 in its open condition shown in FIG. 1, and assuming that storage capacitor 11 is in its discharged condition, transistors 14 and 16 are both conducting, and the resulting low voltage coupled from the emitter of the transistor 14 to the base of transistor 17 in drive circuit 4 serves as the control voltage to hold transistor 17 in its OFF state, which, in turn, holds switching transistor 19 in its OFF state. With transistor 19 in its OFF or non-conducting state, the electric circuit from electric device 2 to the negative terminal of battery 1 is broken, and the electric device 2 is turned OFF. When switch 12 is closed, the battery voltage supplied to the base of transistor 14 drives transistors 14 and 16 to their OFF states. This, in turn, permits the control voltage at the emitter of transistor 14 (that is, at the base of driver transistor 17) to rise to a value of 2 $V_{BE}$, where $V_{BE}$ is the base-emitter voltage drop across the forward biased base-emitter junction of each of transistors 17 and 19. In the case of silicon transistors, $V_{BE} = 0.7$ volts. Consequently, switching transistor 19 is driven to its conducting state, and the electric device 2 is turned ON.

At the same time, the closing of switch 12 causes storage capacitor 11 of timer circuit 6 to charge rapidly to the full battery voltage and to remain charged so long as switch 12 is closed. Thus, the voltage at point P quickly rises to the level of the battery voltage.

When switch 12 is again opened, the charge stored in capacitor 11 discharges through discharge resistor 13 at an exponential decay rate determined by the RC time constant, that is, at a rate determined by the product of the capacitance of storage capacitor 11 and the resistance of discharge resistor 13. When the voltage level stored on storage capacitor 11 falls below the voltage $V_{BE}$, a voltage $V_{BE}$ appears between the emitter and base of transistor 14, and transistor 14 and 16 are turned ON. This reduces the control voltage applied to the base of driver transistor 17 and, as a result, driver transistor 17 and switching transistor 19 are turned OFF, thereby turning OFF electric device 2. In the conventional circuit of FIG. 1, the time between the opening of switch 12 and the turning OFF of electric device 2, hereinafter referred to as the delay time, depends substantially upon the voltage of battery 1. As the battery voltage decreases, the time required for the voltage at point P, that is, the voltage level stored in storage capacitor 11, to decay from its initial value, equal to the battery voltage, to the value $V_{BE}$ at which control circuit 5 is triggered, changes as shown by the solid-line curve A on FIG. 2. Thus, as the battery voltage is reduced from about four volts to about two volts, the delay time between opening of switch 12 and the turning OFF of electric device 2 is also reduced from about 80 seconds to about 40 seconds.

In order to avoid the above-mentioned dependence of the delay time upon battery voltage, an improved timer circuit has been previously proposed which is adapted to present a substantially constant delay time independent of battery voltage. Such an improved timer circuit is described in detail in U.S. Pat. No. 4,267,467, granted May 12, 1981, and having a common assignee herewith. The essential elements of such previously proposed improved timer circuit are here described with reference to FIG. 3, in which circuit elements corresponding to those of the circuit of FIG. 1 are identified with like reference numerals, and a detailed description of such elements is omitted.

In the timer circuit of FIG. 3, a double-pole single-throw switch, provided to selectively couple circuit point P of timer circuit 6 to the positive terminal of the battery 1, includes a first switching element 22 ganged with a second switching element 23. Element 22 couples the battery 1 to a common switching point C and element 23 couples the common switching point C to storage capacitor 11. A diode 25 is included with its anode connected to the common switching point C and with its cathode connected to the base of driver transistor 17. A low-value surge resistor 21 is included between switching element 22 and the positive terminal of battery 1 to protect diode 25 and transistors 17 and 19. Also, in the circuit of FIG. 3, control circuit 5 includes a programmable unijunction transistor (PUT) 24 having its anode connected to resistor 15 and the base of transistor 17, its cathode connected to the negative terminal of battery 1, and its gate connected to sense the voltage level at junction point P.

In the timer circuit of FIG. 3, so long as the gate potential of PUT 24 is higher than its anode potential, PUT 24 is non-conductive, and, as a result, driver transistor 17 and switching transistor 19 are driven to their conductive states, thereby turning electric device 2 ON. However, when the gate potential of PUT 24 is lower than its anode potential, PUT 24 becomes conductive, driver transistor 17 and switching transistor 19 are rendered non-conductive, and electric device 2 is turned OFF.

When switch elements 22,23 are closed, the voltage supplied to storage capacitor 11 is limited to the value of the voltage at the anode of diode 25. This voltage is equal to the junction voltage drop $V_f$ of forward-biased diode 25 plus the base-emitter voltages $V_{BE}$ of transistors 17 and 19. Therefore, the voltage $V_1$ (where $V_1 = V_f + 2 V_{BE}$) is stored in storage capacitor 32 when switch elements 22,23 are closed.

PUT 24 remains non-conductive as long as its gate voltage is more positive than its anode voltage, but conducts when the converse is true. With switch elements 22,23 are closed, a voltage $2 V_{BE} + V_f$ is applied to the gate of PUT 24, but, due to the drop $V_f$ across diode 25, a voltage of only $2 V_{BE}$ appears at the anode. Therefore, PUT 24 is rendered non-conductive when the switch elements 22,32 are closed.

When switch elements 22, 23 are opened to initiate a timing cycle, the charge stored in capacitor 11 is discharged through discharge resistor 13 and the voltage level at junction point P decays from the stored value of $2 V_{BE} + V_f$ until the voltage on the gate of PUT 24 is less than the voltage on its anode. At such time, which occurs when the voltage at point P has decreased to $2 V_{BE}$, PUT 24 is rendered conductive, and thereby provides a short circuit between the base of driver transistor 17 and the negative terminal of battery 1, so that driver transistor 17 and switching transistor 19 are rendered non-conductive, and the electric current through electric device 2 is interrupted.

A shut-off switch 40 may be provided in parallel with storage capacitor 11 to rapidly discharge storage capacitor 11 and thereby render PUT 24 conductive, and immediately turn OFF the electric device 2 without the need to wait for the charge stored in the storage capacitor 11 to decay. Also, a timer override switch 30 may be provided for bypassing the switching transistor 19.

The delay time between the opening of switch elements 23,23 and the turning OFF of electric device 10 is essentially a constant independent of battery voltage as indicated by the dash line B of FIG. 2. However, as is apparent from curves A and B of FIG. 2, for any given storage capacitor 11 and discharge resistor 13, the delay time of the circuit of FIG. 3 will always be significantly less than the delay time of the circuit of FIG. 1. However, if it is desired to increase the RC time constant of the timing circuit 6, it should be noted that merely increasing the value of storage capacitor 11 or increasing the value of discharge resistor 13 may be ineffective to compensate for the aforementioned loss of delay time. More specifically, if a high-value capacitor is selected as storage capacitor 11, the leakage current between the plates of the capacitor can become significant and affect the decay time thereof. Furthermore, high-value capacitors tend to be objectionably bulky and prohibitively expensive for use with small portable radios and the like. Also, even though the gate-anode current of PUT 24 is normally insignificant when PUT 24 is non-conducting, if the value of discharge resistor 13 is selected to an extremely high value, the gate-anode current of PUT 24 becomes quite significant, and can dominate the discharge current from capacitor 11, so that an increase in the value of discharge resistor 13 does not effect a significant increase in the delay time of the timer circuit of FIG. 3.

As the storage capacitor 11 is always charged to a constant voltage $V_1$, where $V_1 = 2 V_{BE} + V_f$, regardless of battery voltage, and because the voltage at point P decays at a rate governed by the values of capacitor 11 and resistor 13, the voltage level stored on capacitor 11 will decay from the voltage $V_1$ to threshold voltage $V_t$ of PUT 24 as indicated by dashline curve C of FIG. 4, and will always reach the threshold voltage $V_t$ at the time $t_1$, regardless of the battery voltage $V_B$.

Timer circuits according to the present invention, avoid the wide difference in timing which occurs in the prior art device of FIG. 1 as the battery voltage decreases with use, without a significant sacrifice in delay time, as occurs with the timer circuit of FIG. 3.

Figure 5:
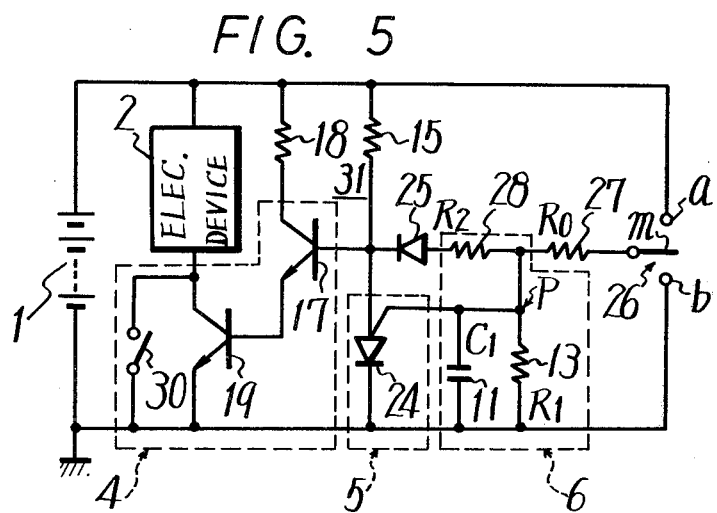
FIG. 5 is a schematic diagram showing one embodiment of a timer circuit according to the present invention.

More particularly, in a first embodiment of the present invention shown on FIG. 5, and in which elements identical with those of the circuits of FIGS. 1 and 3 are identified by the same reference numerals, a three position switch 26 is provided with a movable element m, shown in a neutral position, a first contact a connected with the positive terminal of battery 1, and a second contact b connected to the negative terminal of battery 1. Diode 25 has its cathode connected to the base of transistor 17. A resistor 28 is connected between the anode of diode 25 and a junction point P. A low-value surge resistor 27 is coupled between resistor 28 and movable contact m of switch 26. This surge resistor 27 is included only to prevent excessive current from flowing to the gate of PUT 24.

Figure 6:
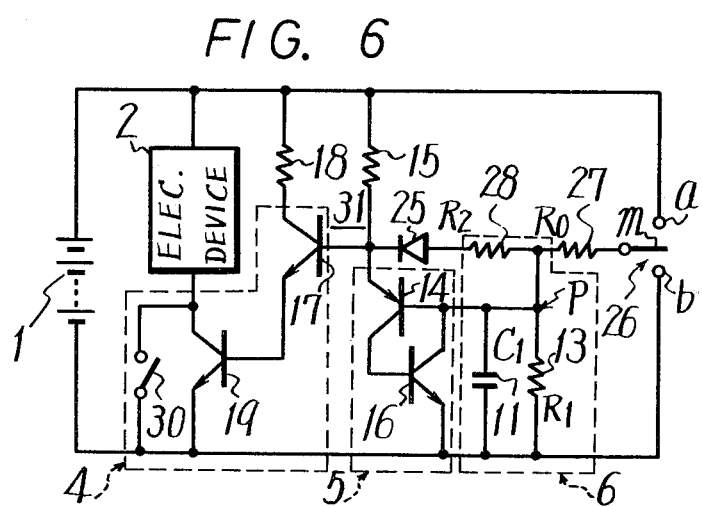
FIG. 6 is a schematic diagram showing another embodiment of a timer circuit according to the present invention.

A second embodiment of the invention is shown on FIG. 6 to be essentially the same as that of FIG. 5, except that control circuit 5 is formed of complementary transistors 14 and 16, rather than the programmable unijunction transistor 24.

In each of the embodiments shown on FIG. 5 and 6, timing circuit 6 includes two discharge paths through which the charge stored on capacitor 11 decays. More specifically, the storage capacitor 11 discharges through resistor 28, diode 25, and the base-emitter junctions of the transistors 17 and 19 until the voltage level at point P reaches constant voltage $V_1 = 2 V_{BE} + V_f$, determined by the forward voltage drop $V_f$ of diode 25 and the base-emitter voltages $V_{BE}$ of transistors 17 and 19. Here diode 25 and the base-emitter junctions of transistors 17 and 19 form a constant voltage circuit 31. Then, storage capacitor 11 continues to discharge through discharge resistor 13 until the trigger voltage of the control circuit 5 is reached.

The resistance values of the resistors 27, 28, and 13 indicated herein as $R_0$, $R_1$, and $R_2$, respectively, are selected to satisfy the relationship $R_0 << R_2 << R_1$.

In a preferred embodiment, $R_0$ can be selected anywhere in the range of 30 ohms to 1000 ohms, but preferably $R_0=100$ ohms. $R_2$ and $R_1$ are preferably selected as 100 kilohms and 11 megohms, respectively.

When movable contact m of switch 26 is in its neutral position, point P is at a neutral potential (that is, the same potential as the negative terminal of battery 1) so that the gate potential of PUT 24 is lower than the anode potential thereof, and PUT 24 is rendered conductive. As a result, the control voltage supplied to driver transistor 17 causes the latter and switch transistor 19 to become non-conductive, and thereby turn OFF electric device 2.

When movable contact m of switch 26 is moved to contact a, current from battery 1 flows through switch 26 and surge resistor 27, and enters storage capacitor 11 so that the potential at point P rapidly reaches the voltage $V_B$ of battery 12. The gate potential of PUT 24 is increased above its anode potential to render PUT 24 non-conductive, and thereby render transistors 17 and 19 conductive so as to energize or turn ON electric device 2.

Thereafter, when switch 26 is returned to its neutral position, the electric charge stored on storage capacitor 11 discharges through the first discharge path formed by resistor 28, diode 25, and the base-emitter junctions of transistors 17 and 19. During this time, the capacitor 11 discharges exponentially at a first rate, as is shown by solid-line curve $D_1$ of FIG. 4, until the potential at the point P reaches the voltage $V_1$ at a time $t_1'$. At that time, the voltage at point P is equal to the voltage at the anode of diode 25, and discharge through the first discharge path ceases. Prior to time $t_1'$, the capacitor 11 also discharges through the discharge resistor 13, but, because the values of the resistances $R_1$ and $R_2$ are separated by an order of magnitude, the amount of discharge at this time through the resistor 13 can be neglected.

After the time $t_1'$, when the voltage level at point P is less than the voltage $V_1$ but greater than the threshold voltage $V_t$ of control circuit 5, the storage capacitor 11 discharges through discharging resistor 13. Because the value $R_1$ of resistor 13 is considerably greater than the value $R_2$ of resistor 28, the rate of exponential discharge after time $t_1'$ is significantly different from the decay rate before the time $t_1'$. As a result, the voltage level at point P decays from the voltage $V_1$ to the threshold voltage $V_t$ along the curve $D_2$ shown in FIG. 4, and reaches the threshold voltage $V_t$ at a time $t_2$. When the voltage level at point P reaches voltage $V_t$, the gate potential of PUT 24 becomes less than the anode potential thereof, so that PUT 24 is turned ON, transistors 17 and 19 become non-conductive, and the electric device 2 is turned OFF. The entire curve D formed of the two solid-line curves $D_1$ and $D_2$ thus illustrates the decay of the voltage level at point P from the battery voltage $V_B$ to the threshold voltage $V_t$. It is further apparent that the delay time required from the timer circuit operation, that is, the time from actuation of switch 26 until the voltage at point P reaches the threshold voltage $V_t$ of the control circuit 5, extends from zero to the time $t_2$ as indicated on the graph of FIG. 4. This time is substantially the sum of the two times $t_1$, and $(t_2-t_1')$, and can be expressed substantially as $KC_1R_1+4C_1R_2$, where $C_1$ is the value of storage capacitor 32 and K is a dimensionless coefficient. As is apparent from FIG. 4, the delay time of the circuit of FIG. 5 is greater than that of the circuit of FIG. 3 by the difference $(t_2-t_1)$. As the portion of the delay time $4C_1R_2$ is substantially unaffected by the voltage $V_B$ of battery 12, and the portion $KC_1R_1$ is completely independent of the voltage $V_B$, the delay time of the timer circuit according to this invention is substantially independent of the voltage of the battery 12. Thus, as shown by chain-line curve E in FIG. 2, the timer circuit of FIG. 5 affords a delay time that is substantially constant over a wide range of battery voltages, while being insignificantly longer than the delay time (curve B) of the timer circuit of FIG. 3.

If the movable contact m of switch 26 is contacted with contact b, storage capacitor 11 discharges rapidly through surge resistor 27 thereby allowing a listener to optionally turn electric device 2 OFF without waiting for the entire delay time to expire.

As the control circuit 5 of the FIG. 6 embodiment uses a pair of complementary transistors 14,16 to form a circuit which is roughly the functional equivalent of a thyristor, such as, a programmable unijunction transistor, the operation of the circuit of FIG. 6 is substantially the same as that of the embodiment of FIG. 5.

When constructed according to this invention, a timer circuit may be provided with a rather long delay time substantially independent of battery voltage, and a relatively simple construction. Furthermore, as is apparent from the above-described embodiments of this invention, switching transistor 19 and driver transistor 17 can serve the additional function of providing a constant voltage at the base of transistor 17, thereby markedly simplifying the construction in comparison to other possible arrangements. Moreover, it is apparent that the provision of the single switch 26 in place of, for example, the double-pole, single-throw switch made up of elements 22,23 and the shut off switch 40 of FIG. 3, further simplifies construction of the timer circuit.

In the above-described embodiments, if a variable capacitor is used as the storage capacitor 11 or if variable resistors are used as resistors 13 and 28, the delay time of the timer circuit can be selectively adjusted.

Also, a voltage source independent of battery 1 can be provided to power electric device 2. Further, a relay could be used in place of switching transistor 19, and a plurality of diodes may be connected in series in place of diode 25.

Although illustrative embodiments of the invention and various modifications have been described in detail herein with reference to the accompanying drawings, it is to be understood that the invention is not limited thereto, and that other embodiments and possible modifications and variations thereof may be effected by a person of ordinary skill in the art, without departing from the spirit or scope of the present invention as defined in the appended claims.

What is claimed is:

1. A timer circuit for connecting a DC voltage source to an electric device comprising;
   switching means adapted to be connected between said source and said device and having conductive and nonconductive states;
   drive means for said switching means having a control input and being operative to selectively establish said states of the switching means in response to a control voltage applied to said control input;
   timing means for holding a voltage level that initially decays at a first decay rate through a first discharge path from a first voltage related to the voltage of said source to a second voltage and subsequently decays at a second decay rate through a second discharge path from said second voltage to a third voltage; and means for providing said control voltage to said control input of the drive means to cause the latter to establish one of said states of the switching means when said voltage level is above said third voltage and to establish the other of said states when said voltage level has decayed to said third voltage.

2. A timer circuit according to claim 1, wherein said switching means includes a switching transistor having a control electrode and further having an output electrode coupled to said electric device, and said drive means includes a driver transistor having a control electrode coupled to said control input and an output electrode coupled to the control electrode of said switching transistor to control the latter.

3. A timer circuit according to claim 2, wherein said timing means includes a storage capacitor selectively connectable to said DC voltage source to charge to said first voltage; a first resistive discharge path through which said storage capacitor discharges until the latter reaches said second voltage; and a second resistive discharge path through which said storage capacitor discharges until the latter reaches said third voltage; and said means for providing said control voltage includes control means responsive to the voltage of said storage capacitor to provide said control voltage at a first level when the voltage of said storage capacitor is above said third voltage and at a second level when the voltage of said storage capacitor has decayed to said third voltage.

4. A timer circuit according to claim 3, wherein said switching transistor and said driver transistor are bipolar junction transistors having emitters and bases; and said first resistive discharge path includes a series circuit formed of a resistor and the emitter-base junctions of said switching and driver transistors.

5. A timer circuit according to claim 4, wherein said first resistive discharge path further includes a diode coupled between said resistor and the emitter-base junction of said driver transistor.

6. A timer circuit according to claim 4, wherein said second resistive discharge path includes a discharge resistor having a resistance value greater than that of the resistor of said first resistive discharge path.

7. A timer circuit according to claim 1, wherein said timing means includes a storage capacitor selectively connectable to said DC voltage source to charge to said first voltage, a first resistive discharge path through which said storage capacitor discharges until the latter reaches said second voltage, and a second resistive discharge path through which said storage capacitor discharges until the latter reaches said third voltage; and said means for providing said control voltage includes control circuit means responsive to the voltage of said storage capacitor to provide said control voltage at a first level when the voltage of said storage capacitor is above said third voltage and at a second level when the voltage of said storage capacitor has decayed to said third voltage.

8. A timer circuit according to claim 7, wherein said first resistive discharge path includes a constant voltage source having a terminal providing a constant voltage at said second voltage, and a resistor coupled between said terminal of said constant voltage source and said storage capacitor.

9. A timer circuit according to claim 8, wherein said constant voltage source includes at least one forward-biased diode junction.

10. A timer circuit according to claim 7, wherein said control circuit means includes a device functioning as a thyristor and having first and second output electrodes and a control electrode, said first output electrode provides said control voltage, and said second output electrode and said control electrode are connected across said storage capacitor.

11. A timer circuit according to claim 10, wherein said device functioning as a thyristor is a programmable unijunction transistor having an anode, a cathode, and a gate, and said first output electrode, said second output electrode, and said control electrode are said anode, said cathode, and said gate, respectively.

12. A timer circuit according to claim 10, wherein said device functioning as a thyristor includes a pair of complementary transistors each having a collector, an emitter, and a base, the base and the collector of one of said pair of transistors are respectively connected to the collector and base of the other of said pair of transistors, the emitters of said transistors form said first and second output electrodes, and the base of said one of said pair of transistors forms said control electrode.

13. A timer circuit for connecting a DC voltage source to an electric device comprising a switching transistor having a pair of current carrying electrodes respectively connected to said device and to said voltage source, and a control electrode; a drive transistor having a control electrode and an output electrode connected to the control electrode of said switching transistor; a device functioning as a thyristor having an anode output terminal coupled to the control electrode of said drive transistor, a cathode terminal, and a gate electrode; a timer capacitor having first and second plates respectively connected to said gate electrode and to said cathode terminal; a series discharge circuit, formed of a discharge resistor and a forward-biased diode, coupled between said first place of said timer capacitor and said control electrode of said driver transistor; another discharge resistor coupled between said first and said second plates of said timer capacitor; and switch means for selectively coupling said DC voltage source to said first plate of said timer capacitor to charge the same.

* * * * *